US012775143B2

(12) United States Patent
Romero Garcia et al.

(10) Patent No.: US 12,775,143 B2
(45) Date of Patent: Oct. 27, 2026

(54) OPTICAL SUBSYSTEM WITH FLAT LENSES FOR MULTIMODE TRANSCEIVERS

(71) Applicant: Cisco Technology, Inc., San Jose, CA (US)

(72) Inventors: Sebastian Romero Garcia, Málaga (ES); Michael Tittenhofer, Fuerth (DE); Stefan Wiese, Eckental (DE); Christian R. Raabe, Nuremberg (DE)

(73) Assignee: Cisco Technology, Inc., San Jose, CA (US)

(*) Notice: Subject to any disclaimer, the term of this patent is extended or adjusted under 35 U.S.C. 154(b) by 436 days.

(21) Appl. No.: 18/358,724

(22) Filed: Jul. 25, 2023

(65) Prior Publication Data

US 2025/0035865 A1 Jan. 30, 2025

(51) Int. Cl.

| | |
|---|---|
| ***G02B 6/42*** | (2006.01) |
| ***G02B 1/00*** | (2006.01) |
| ***G02B 6/028*** | (2006.01) |
| ***H01S 5/183*** | (2006.01) |
| ***H04B 10/2581*** | (2013.01) |
| ***H10F 30/223*** | (2025.01) |

(52) U.S. Cl.

CPC ........... *G02B 6/4246* (2013.01); *G02B 1/002* (2013.01); *G02B 6/0288* (2013.01); *G02B 6/4206* (2013.01); *G02B 6/4214* (2013.01); *G02B 6/4293* (2013.01); *H01S 5/18388* (2013.01); *H10F 30/223* (2025.01); *G02B 2207/101* (2013.01); *H04B 10/2581* (2013.01)

(58) Field of Classification Search

CPC .. G02B 6/4246; G02B 6/0288; G02B 6/4293; G02B 1/002; G02B 2207/101; H10F 30/223; H01S 5/18388; H04B 10/43; H04B 10/2581

See application file for complete search history.

(56) References Cited

U.S. PATENT DOCUMENTS

| | | | | |
|---|---|---|---|---|
| 10,756,839 B1 * | 8/2020 | Cheung | ............... | H04J 14/0256 |
| 2004/0057648 A1 * | 3/2004 | Yunus | .................. | G02B 6/4214 385/14 |

(Continued)

OTHER PUBLICATIONS

P-i-n Photodiodes, RP Photonics Encyclopedia, accessed from Wayback Archive dated Apr. 11, 2021 of URL https://www.rp-photonics.com/p_i_n_photodiodes.html (Year: 2021).*

(Continued)

*Primary Examiner* — Thomas A Hollweg
*Assistant Examiner* — Kirsten D. Endresen
(74) *Attorney, Agent, or Firm* — Patterson + Sheridan, LLP

(57) ABSTRACT

An optical subsystem with flat lenses for multimode transceivers is provided. The optical subsystem includes a photonic integrated circuit (PIC). The optical subsystem also includes a vertical cavity surface emitting laser (VCSEL) disposed on the PIC, a photodetector disposed on the PIC, a transmit multimode fiber (TX-MMF) disposed on the PIC, and a receiver multimode fiber (RX-MMF) disposed on the PIC. The PIC includes a substrate, an oxide layer disposed above the substrate, and a plurality of metalenses disposed in the oxide layer. The substrate includes a polymer region and a mirror disposed at a base of the polymer region.

20 Claims, 5 Drawing Sheets

(56) References Cited

U.S. PATENT DOCUMENTS

| | | | | |
|---|---|---|---|---|
| 2004/0179784 | A1* | 9/2004 | Vancoille ............. | G02B 6/4214<br>385/47 |
| 2008/0226228 | A1 | 9/2008 | Tamura et al. | |
| 2017/0131469 | A1 | 5/2017 | Kobrinsky et al. | |
| 2018/0013262 | A1 | 1/2018 | Caer et al. | |
| 2018/0359033 | A1 | 12/2018 | Xu et al. | |
| 2019/0064532 | A1* | 2/2019 | Riley, Jr. .............. | G02B 6/4201 |
| 2022/0065407 | A1* | 3/2022 | Wei .................... | G02B 27/0172 |

OTHER PUBLICATIONS

Gebreyesus H., "Integration of Electronics and Photonics on Monolithic Silicon to Improve the Performance of Conventional Electronic Devices", Addis Ababa University, School of Electrical and Computer Engineering, Dec. 29, 2016, 55 Pages.

* cited by examiner

OPTICAL SUBSYSTEM WITH FLAT LENSES FOR MULTIMODE TRANSCEIVERS

TECHNICAL FIELD

Embodiments presented in this disclosure generally relate to optical networking, and more specifically, to optical subsystems for multimode transceivers.

BACKGROUND

Lasers are used in optical communications to transmit digital data across a fiber-optic network. The laser or laser light emitted therefrom may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber optic network. Such fiber optic networks enable modern computing devices to communicate at high speeds and over long distances.

Communication modules, such as electronic or optoelectronic transmitters, transceivers, or transponder modules are increasingly used in optical communication. Communication modules often communicate with a host computing device via a printed circuit board (PCB) by transmitting, receiving, or transmitting and receiving electrical data signals to and/or from the host computing device PCB. The electrical data signals can also be transmitted by the communication module outside a host device as optical and/or electrical data signals. Many communication modules include an optical subassembly (OSA), such as a transmitter optical subassembly (TOSA) and/or receiver optical subassembly (ROSA) to convert between the electrical and optical domains.

Generally, a TOSA transforms an electrical signal received from the host computing device to an optical signal that is transmitted onto an optical fiber or other transmission medium. A laser diode or similar optical transmitter included in the TOSA is driven to emit the optical signal representing the electrical signal received from the host computing device. A TOSA can include single-mode or multi-mode vertical cavity surface emitting lasers (VCSELs). A single-mode VCSEL can transmit an optical signal having a single wavelength along a singlemode (SM) fiber or a multimode (MM) fiber. A multimode VCSEL can transmit an optical signal along a multimode (MM) fiber.

Generally, a ROSA transforms an optical signal received from an optical fiber or another source to an electrical signal that is provided to the host computing device. A photodiode or similar optical receiver included in the ROSA transforms the optical signal to the electrical signal. The ROSA can include one or an array of pin photodiodes, for example. The ROSA can receive the optical signals from the TOSA over one or more optical fibers.

Recently, silicon photonics has been used as a technology that can form the basis of some optical interconnects. For example, silicon photonics enable the communication of optical signals through a photonic circuit built on the silicon substrate. The incorporation of optical components into a silicon chip with electrical elements can be obtained using silicon photonics to form a photonic integrated circuit (PIC). However, for certain optical applications involving high speed optical components, the fabrication and integration of optical components with a PIC can be significantly complex, time consuming, and lack cost effectiveness.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
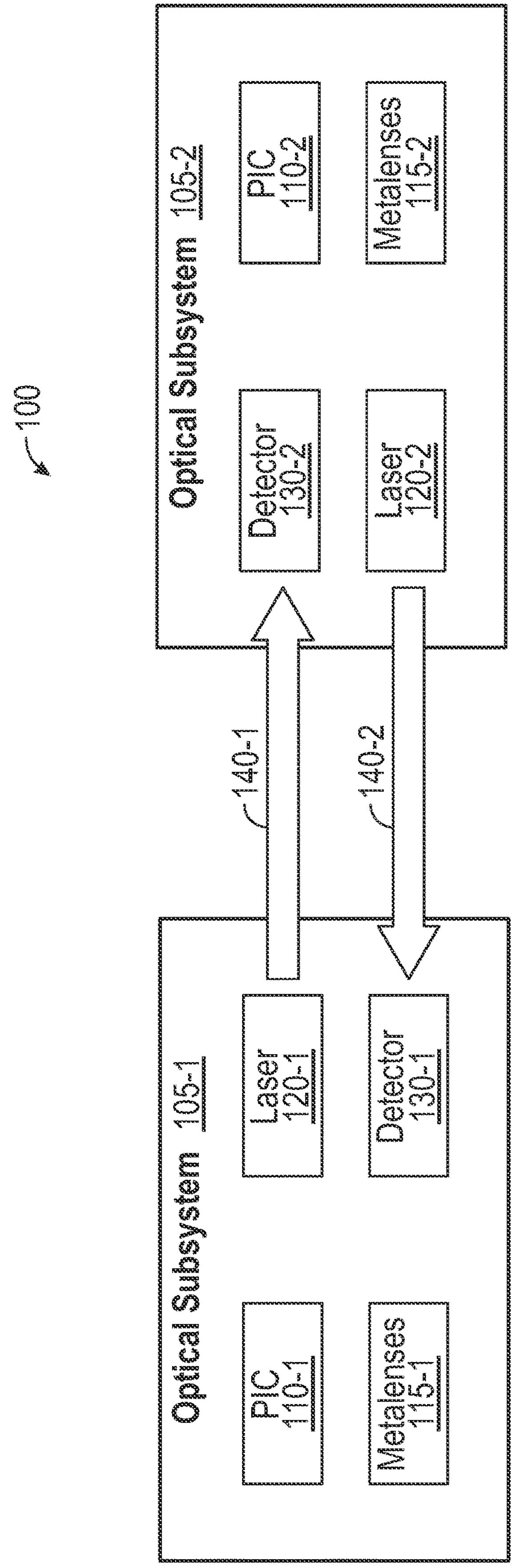
FIG. 1 illustrates an example system, according to one embodiment.

One embodiment described herein is an optical apparatus. The optical apparatus includes: a photonic integrated circuit (PIC); a vertical cavity surface emitting laser (VCSEL) disposed on the PIC; a photodetector disposed on the PIC; a transmit multimode fiber (TX-MMF) disposed on the PIC; and a receiver multimode fiber (RX-MMF) disposed on the PIC. The PIC includes: a substrate including (i) a polymer region and (ii) a mirror disposed at a base of the polymer region; an oxide layer disposed above the substrate; and a plurality of metalenses disposed in the oxide layer.

Another embodiment described herein is a method for fabricating an optical apparatus. The method includes: forming a photonic integrated circuit (PIC); forming a vertical cavity surface emitting laser (VCSEL) on the PIC; forming a photodetector on the PIC; forming a transmit multimode fiber (TX-MMF) on the PIC; and forming a receiver multimode fiber (RX-MMF) on the PIC. Forming the PIC includes: forming a substrate; forming an oxide layer above the substrate and comprising a plurality of metalenses; forming a polymer region within the substrate; and forming a mirror at a base of the polymer region.

Another embodiment described herein is a system. The system includes a first optical transceiver module and a second optical transceiver module. The first optical transceiver module is coupled to the second optical transceiver module via one or more multimode fibers (MMFs). The first optical transceiver module includes: a photonic integrated circuit (PIC); a vertical cavity surface emitting laser (VCSEL) disposed on the PIC; a photodetector disposed on the PIC; a first of the one or more MMFs disposed on the PIC; and a second of the one or more MMFs disposed on the PIC. The PIC includes: a substrate including (i) a polymer region and (ii) a mirror disposed at a base of the polymer region; an oxide layer disposed above the substrate; and a plurality of metalenses disposed in the oxide layer.

Example Embodiments

While silicon photonics technologies can potentially enable higher fabrication throughput, higher scalability, and lower integration costs in the next generation of multimode optical transceivers, certain challenges still exist with conventional approaches used to integrate optical components with PICs that can impact the potential advantages of silicon photonics technologies. As an example, consider pluggable optical transceivers for short-reach communication links (e.g., in datacenters). These optical transceivers generally use VCSELs, vertical PIN photodetectors (or photodiodes) (generally referred to herein as vertical PIN diodes), and graded-index multimode fibers (MMFs) with a certain core diameter (e.g., 50 micrometer (um) core diameter).

To support high speed optical components in such pluggable optical transceivers, there generally has to be an efficient light coupling between the VCSELs and transmit MMFs (TX-MMFs) (also referred to as output MMFs) at the transmitter channels as well as an efficient light coupling between the receive MMFs (RX-MMFs) (also referred to as input MMFs) and vertical PIN diodes at the receiver channels. Moreover, to achieve such an efficient light coupling, there generally has to be a transformation in size and angular divergence of the optical beams at both the transmitter channels and receiver channels.

For example, typical VCSEL beams have a large angular divergence and thereby require a size magnification, or equivalently divergence reduction, before coupling into the core of the TX-MMFs. On the other hand, the size of the beams from the RX-MMFs (e.g., with 50 um core diameters) generally has to be reduced at the surface of the high speed vertical PIN diodes, which typically have an optical aperture with a diameter of less than 25 um. Moreover, for current pluggable modules with a compact height, the input and output fiber pigtails of TX-MMFs and RX-MMFs are routed parallel to the electrical circuit board of the module. Thereby, there is a preference for an optical 90 degree (°) turn of the vertical beams of VCSELs and vertical PIN diodes into the in-plane light propagation orientation of the TX and RX-MMFs instead of a more complex rotated assembly of VCSEL and PIN relative to the electrical circuit board of the module.

Current approaches for integrating optical components, such as VCSELs and vertical PIN diodes, with PICs generally involve using a single-piece molded polymer unit with two aspherical lens arrays on two of its surfaces and a 90° turn mirror. A first lens array, referred to as a device lens array, is positioned several hundreds of micrometers relative to the top of the VCSELs and vertical PIN diodes. A second lens array, referred to as a fiber lens array, is positioned several hundreds of micrometers in front of the cores of the TX-MMFs and RX-MMFs. The MMFs are assembled on a ferrule with desired separation between fibers and with connector terminations. The ferrule with the fibers is inserted into the molded polymer unit, resulting in an optical assembly (with mechanical support for the MMFs) generally referred to as a fiber harness or fiber harness unit.

Conventionally, during the transceiver assembly process, the VCSELs and vertical PIN diodes are initially bonded onto a common substrate. Then, the fiber harness unit is aligned to the VCSELs and vertical PIN diodes and fixed to the substrate by epoxy. This conventional approach of integrating the VCSELs and vertical PIN diodes with the fiber harness unit can result in increased manufacturing costs due to several factors. One example factor includes a relatively long assembly time due to the 6-axis adjustment of the fiber harness. Another example factor includes potential yield loss due to placement inaccuracy of the VCSELs and vertical PIN diodes. For example, in cases involving the assembly of several singulated VCSELs and vertical PIN diodes, at die bonding time, the VCSELs and vertical PIN diodes can be placed and bonded inaccurately due to the inaccuracy of the bonding machine, unaligned position of the optical path defined by the lens array, or a combination thereof. Yet another example factor includes yield loss due to significant misalignments between the MMFs and the optical components during epoxy curing (e.g., post-cure shifts). A further example factor is that the conventional optical subsystem does not allow an efficient testing step—such as burn in—of bonded VCSELs and vertical PIN diodes prior to the assembly of the complete transceiver, making it difficult to identify defective optical units early in the assembly process.

Accordingly, embodiments described herein provide an improved optical system for multimode transceivers that overcomes the integration limitations and problems of conventional approaches. As described herein, certain embodiments utilize wafer-level passive flip-chip assembly of VCSELs and vertical PIN diodes on top of flat lenses fabricated on a PIC. The PIC described herein provides a mechanical substrate where the optical components can be bonded with micrometric placement accuracy and high throughput using pick and place systems. Additionally, the PIC described herein enables the implementation of flat lenses with sub-wavelength features that target the desired optical beam transformation, collimation, and focusing for an efficient optical coupling into the TX-MMFs and from the RX-MMFs. Thus, during the assembly process of the optical subsystem described herein, the VCSELs, vertical PIN diodes, and MMFs are attached to a substrate targeting a high placement accuracy relative to each other as well as to the center of the flat lenses. Note the flat lenses with sub-wavelength features may also be referred to as metalenses, metasurfaces, or diffractive optical elements (DOEs).

In this manner, the assembly of the optical components directly on such a PIC with metalenses overcomes the issues associated with conventional processes used for fixing external lenses onto a common substrate, such as the necessity of a complex and time-consuming 6-axis optical alignment of external lenses and problems derived from post-cure shift of the epoxy. Additionally, in certain embodiments, the optical subsystem described herein is an independent unit that can be assembled before integration with the rest of the transceiver system and therefore allows for early stage testing for identification of defective parts.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected there between).

FIG. 1 illustrates an example system 100, according to one embodiment. In certain embodiments, the system 100 is representative of optical communication (e.g., short reach communication link) within a datacenter, as an illustrative, non-limiting example. The system 100 includes, without limitation, an optical subsystem 105-1 and an optical subsystem 105-2, which can communicate with each other via one or more MMFs 140 1-2. The optical subsystems 105 1-2 may be optical transceiver modules, such as pluggable optical transceivers as an illustrative, non-limiting example.

In one example, the optical subsystem 105-1 may receive an electrical signal from a computing device (not shown), convert the electrical signal into an optical signal, and transmit the optical signal through the MMF 140-1 to the optical subsystem 105-2. The optical subsystem 105-2 may convert the optical signal into an electrical signal, which may be used by another computing device (not shown) coupled to the optical subsystem 105-2. Similarly, in another example, optical subsystem 105-2 may receive an electrical signal from a computing device (not shown), convert the electrical signal into an optical signal, and transmit the optical signal through the MMF 140-2 to the optical subsystem 105-1. The optical subsystem 105-1 may convert the optical signal into an electrical signal, which may be used by another computing device (not shown) coupled to the optical subsystem 105-1.

Thus, in certain embodiments, each optical subsystem 105 includes (i) a TX channel formed by the respective laser 120 and MMF 140 and (ii) a RX channel formed by the respective detector 130 and MMF 140. For example, from the perspective of optical subsystem 105-1, the TX channel includes laser 120-1 and MMF 140-1, which is used as the TX-MMF for optical subsystem 105-1, and the RX channel includes detector 130-1 and MMF 140-2, which is used as the RX-MMF for optical subsystem 105-1. Similarly, from the perspective of optical subsystem 105-2, the TX channel includes laser 120-2 and MMF 140-2, which is used as the TX-MMF for optical subsystem 105-2, and the RX channel includes detector 130-2 and MMF 140-1, which is used as the RX-MMF for optical subsystem 105-2.

Although not shown in FIG. 1, each of the optical subsystems 105 1-2 may include at least a portion of the MMF 140-1 and the MMF 140-2. Note, the optical subsystems 105 1-2 may be configured for high speed, short-range data communication (e.g., up to 300 meters).

Each optical subsystem 105 includes, without limitation, a laser 120, a detector 130, a PIC 110, and two or more metalenses 115. Laser 120 is representative of any type of surface-emitting laser chip that generates optical signals, such as a VCSEL. The detector 130 is representative of any type of semiconductor detector (e.g., photodiodes or photodetectors) that converts optical signals to electrical signals. In certain embodiments, the detector 130 is a vertical PIN diode.

The metalenses 115 are optical components that modify light over a wavelength scale thickness, changing the phase, amplitude and polarization. The metalenses 115 generally have a flat form factor and include arrays of subwavelength-spaced scattering elements. Compared to traditional diffractive optics relying on gradual phase accumulation, the phase response for metalenses generally arises from Pancharatnam-Berry phase elements and the in-plane anisotropy of the scatter or from a cavity-like effect in which the scatter behaves as a truncated waveguide supporting a mixture of Fabry-Perot resonances. For certain metalenses, the subwavelength spatial resolution of the metalenses at the design wavelength eliminates higher diffraction orders for normal incidence (e.g., any incidence for lattice spacing less than half wavelength ($\lambda/2$)).

The PIC 110 provides a mechanical substrate for bonding the laser 120 and detector 130. Additionally, as described in greater detail herein, the PIC 110 also enables the implementation of one or more metalenses 115, to allow for the desired optical beam transformation, collimation, and focusing for an efficient optical coupling into the TX-MMFs and from the RX-MMFs.

Figure 2A:
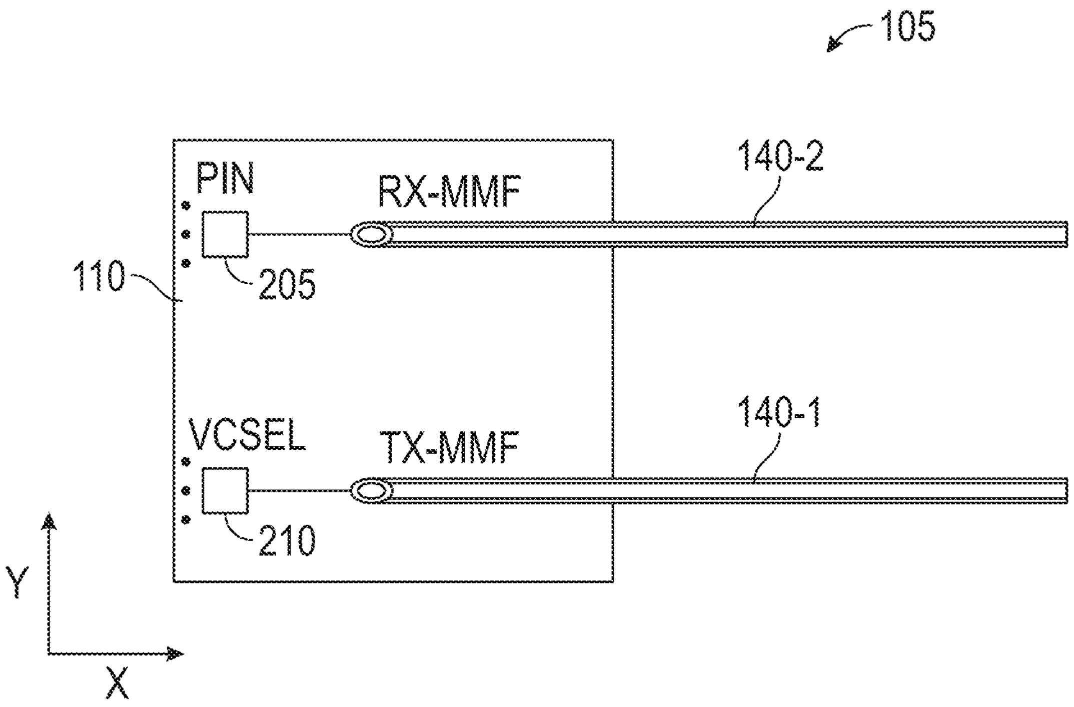
FIG. 2A illustrates a top view of an example optical subsystem, according to one embodiment.
Figure 2B:
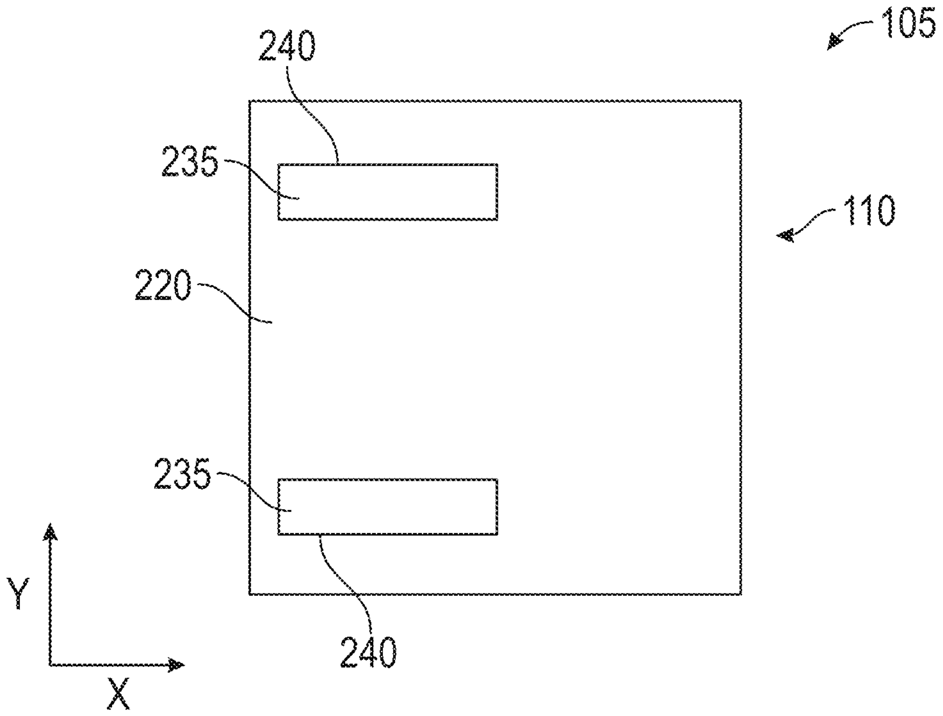
FIG. 2B illustrates a bottom view of the example optical subsystem, according to one embodiment.
Figure 2C:
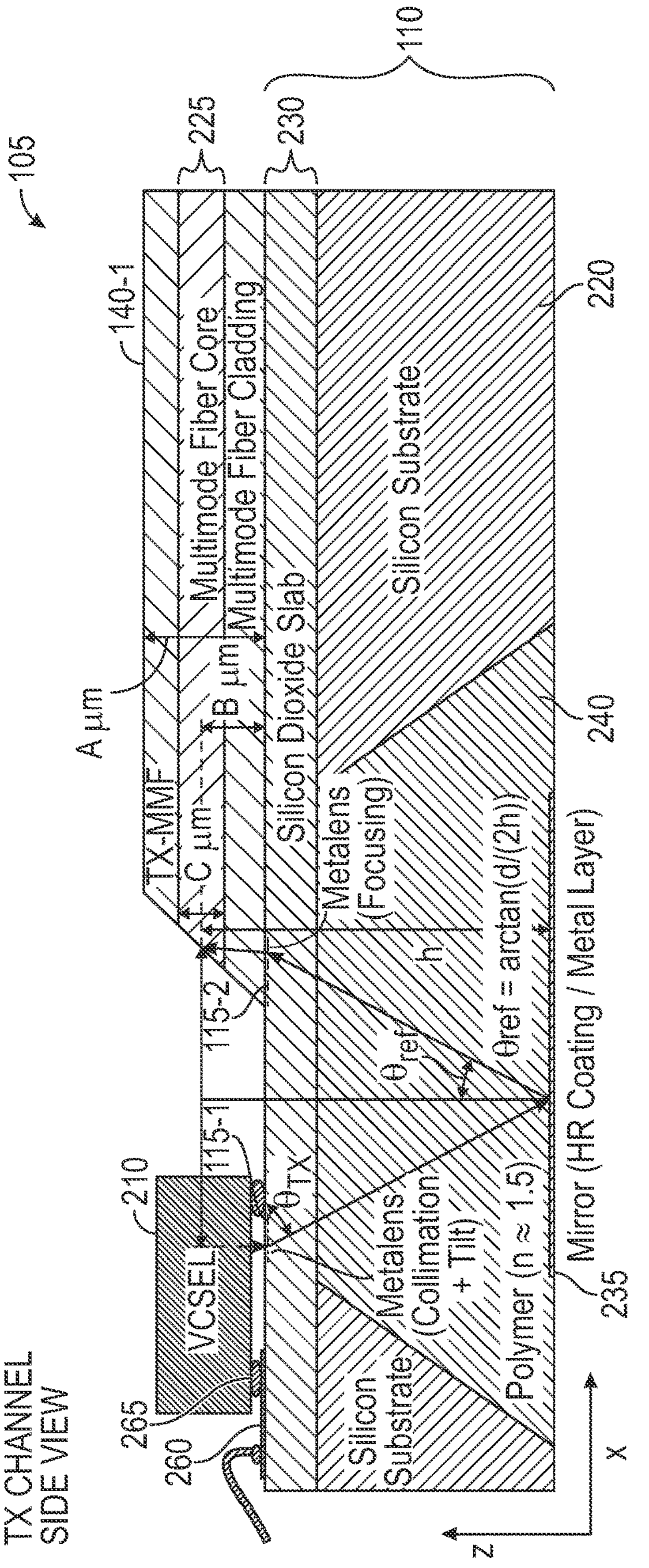
FIG. 2C illustrates a side view of the example optical subsystem, according to one embodiment.
Figure 2D:
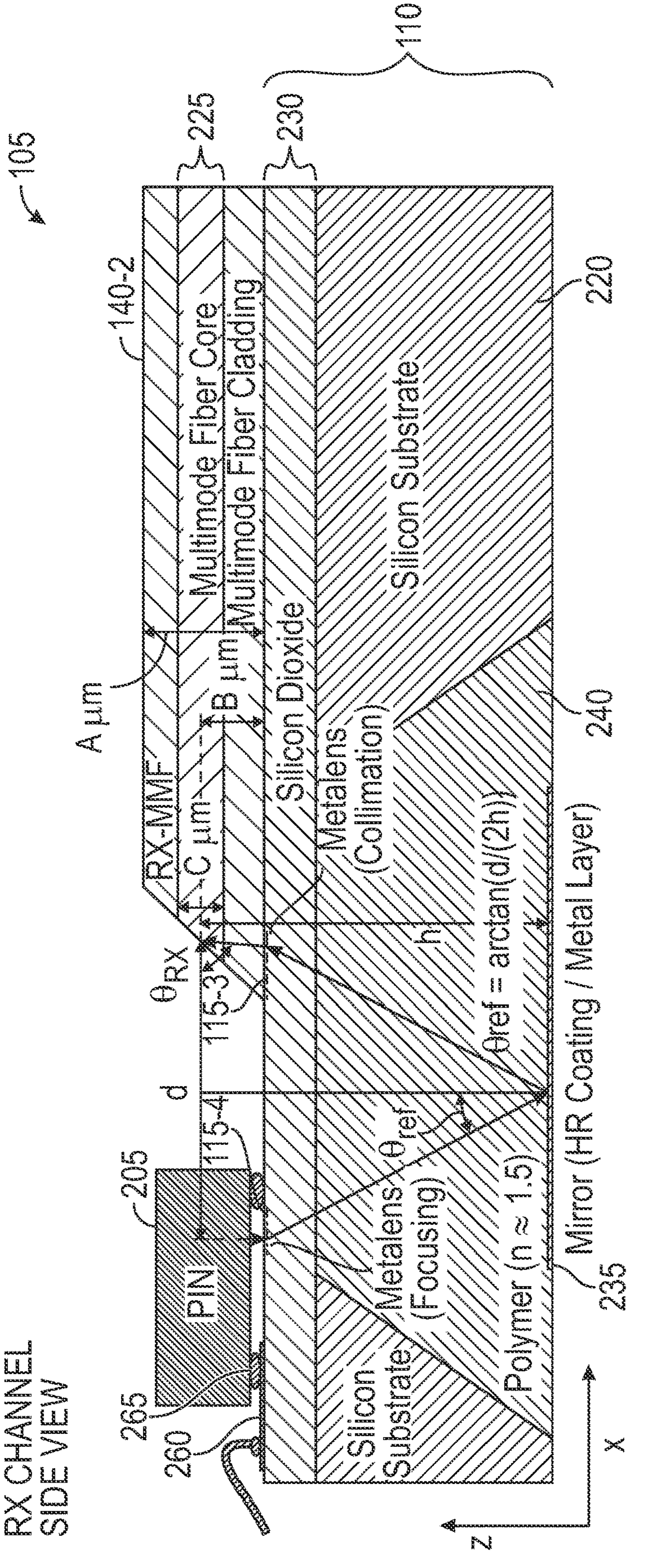
FIG. 2D illustrates another side view of the example optical subsystem, according to one embodiment.

FIGS. 2A-2D illustrate different views of an example optical subsystem 105, according to one embodiment. In particular, FIG. 2A shows a top view of the optical subsystem 105, FIG. 2B shows a bottom view of the optical subsystem 105, FIG. 2C shows a side view of the optical subsystem 105, and FIG. 2D shows another side view of the optical subsystem 105, according to one embodiment.

In certain embodiments, the PIC 110 includes a substrate 220 (e.g., silicon (Si) substrate) and an oxide layer 230 disposed above and on the substrate 220 (FIGS. 2C and 2D). The oxide layer 230 may be formed with silicon dioxide ($SiO_2$). In certain embodiments, the oxide layer 230 may have a thickness of several micrometers and the substrate 220 may have a thickness of hundreds of micrometers.

The PIC 110 also includes one or more metalenses 115 used for transforming (e.g., collimating, tilt, focusing, and other transformations) optical beams onto the TX-MMF or from the RX-MMF. In certain embodiments, the metalenses 115 are disposed within the oxide layer 230. For example, the PIC 110 may be fabricated with one or more layers of silicon nitride ($Si_3N_4$) buried into the oxide layer 230 of $SiO_2$. The oxide layer 230 and silicon nitride layer(s) may then be selectively etched by means of optical lithography and reactive ion etching to allow the definition of nanopillars and nanoholes with very high placement accuracy (e.g., via CMOS standard backend wafer processing) and with a moderate refractive index contrast to air to achieve the target optical phase shift for the implementation of the metalenses 115. For example, the TX channel of the optical subsystem 105 includes metalenses 115 1-2 disposed in the oxide layer 230 of PIC 110 (FIG. 2C), and the RX channel of the optical subsystem 105 includes metalenses 115 3-4 disposed in the oxide layer 230 of PIC 110 (FIG. 2D).

In certain embodiments, the PIC 110 also includes one or more electrical pads 260 disposed on the oxide layer 230. The electrical pads 260 may be used for (i) flip-chip bump bonding of optical components, such as VCSEL 210 and vertical PIN diode 205, (ii) transmission lines for routing electrical signals to additional pads on the edge of the PIC for wire-bonding the optical subsystem 105 with electrical devices, such as laser drivers and transimpedance amplifiers (not shown), or (iii) a combination thereof. The PIC 110 may be fabricated with a top metal layer and the top metal layer may then be etched to form the electrical pads 260.

As shown in FIGS. 2B, 2C, and 2D, the PIC 110 also includes a polymer region 240 disposed within the substrate 220. The polymer region 240 may be used to avoid the optical absorption of silicon. The polymer region 240 may be formed by locally removing regions of the substrate 220, e.g., using a CMOS compatible backside etching. The etched regions of the substrate 220 may then be filled with a polymer to form the polymer region 240. In certain embodiments, the polymer region 240 includes a polymer material with a refractive index matched to 1.5 (e.g., n=1.5) in order to avoid Fresnel losses due to the contrast between the refractive index of air and silicon dioxide.

As also shown in FIGS. 2B, 2C, and 2D, the PIC 110 also includes a (low loss) mirror 235 disposed at the bottom of the PIC 110. In certain embodiments, the mirror 235 may be implemented via a high reflective (HR) coating deposited at the base of the polymer region 240 or by a metal layer at the carrier surface where the PIC 110 is attached. In certain embodiments, the mirror 235 has a reflection angle, $\theta_{ref}$.

In certain embodiments, the TX-MMF 140-1 and the RX-MMF 140-2 are graded-index MMFs with a cladding diameter of A μm, a core diameter of C μm, and a radial distance of B μm, where A>B>C. In certain embodiments, A=125, B=62.5, and C=50.

In the integration approach described herein, the X-Z optical propagation plane for each pair VCSEL 210/vertical PIN diode 205 and TX-MMF 140-1/RX-MMF 140-2 is defined by a vertical direction (Z axis) that is coincident with the height of PIC 110 and the direction defined by a line (e.g., length d) that connects the centers of the VCSEL/vertical PIN diode optical aperture and the centers of the cores of the corresponding TX/RX-MMFs (X axis). On the other hand, the top surfaces of the PIC 110, VCSEL 210, and vertical PIN diode 205 are in the X-Y plane.

As shown in FIG. 2C and FIG. 2D, once flip-chip bonded on the PIC 110, the emission direction of the VCSEL 210 is in a negative vertical direction (e.g., −Z axis) and an accurate vertical placement of the VCSEL surface relative to the top surface of the PIC 110 can be enabled by controlling the height of the solder bump 265. The TX-MMF 140-1 and the RX-MMF 140-2 are routed along the X direction and the optical propagation direction of the emitted and received MMF beams are rotated from the X axis by an angle alpha ($\alpha$) near to 90°. This rotation angle, alpha ($\alpha$), may be achieved by a total internal reflection (MMF-TIR) mirror implemented by polishing the endface of the MMFs by an angle close to 45°, e.g., as shown in FIGS. 2C and 2D. The polishing and attachment of MMF arrays, including both RX-MMFs and TX-MMFs can be simplified by integrating them into a fiber array unit (FAU).

As shown in FIG. 2C, at the upper surface of the PIC 110 on the TX side, the optical beams emitted from the VCSEL 210 are collimated by a first array of metalenses 115-1 with effective focal lengths of several tens of micrometers. In certain embodiments, the metalenses 115-1 also tilt the propagation of the optical beams at an angle $\theta_{TX}$ (e.g., approximately 10°) in the X-Z plane. In such embodiments, the top surface of the PIC 110 may be covered with anti-reflection (AR) coating in order to avoid laser instabilities due to back reflection. Alternatively, in certain embodiments, the angle $\theta_{TX}$ may be achieved by directly bonding the VCSEL 210 with the predefined tilting angle. In such embodiments, the impact of the possible optical feedback due to back reflection in the air-silicon dioxide interface can be reduced.

As further shown in FIG. 2C, the collimated optical beam(s) is reflected by the mirror 235 at a reflection angle, $\theta_{ref}$, where $\theta_{ref}$=arctan (d/(2 h)), where h is the height between the bottom reflector (e.g., mirror 235) and the center of the fiber core (e.g., core 225). Once reflected, the optical beam propagates upwards and passes through a second array of metalenses 115-2, which focus the optical beams into the corresponding core 225 of the TX-MMF 140-1 core at the TX channels. Additionally, in certain embodiments, the endface of the TX-MMF 140-1 proximal to the VCSEL 210 has an inclined surface for a MMF-TIR mirror, such that the focused optical beam (from the metalenses 115-2) is reflected onto the core 225 of the TX-MMF 140-1.

As shown in FIG. 2D, at the upper surface of the PIC 110 on the RX side, the optical beams radiated in the horizontal direction by the RX-MMF 140-2 may be rotated into a vertical propagation direction by the MMF-TIR mirror implemented at the endface of the RX-MMF 140-2. For example, the endface of the RX-MMF 140-2 proximal to the photodetector (e.g., vertical PIN diode 205) has an inclined surface for a MMF-TIR mirror, such that an optical beam may be output from the RX-MMF 140-2 at a tilted angle. In particular, the radiated horizontal optical beams may be reflected by the MMF-TIR mirror of the RX-MMF 140-2 at a tilt angle, $\theta_{RX}$, towards a third array of metalenses 115-3. Note, on the RX side, the tilt angle $\theta_{RX}$ may be directly implemented by the MMF-TIR mirror.

The metalenses 115-3 may collimate the optical beams from the RX-MMF 140-2. The collimated optical beam(s) is reflected by the mirror 235 at a reflection angle, $\theta_{ref}$, where $\theta_{ref}$=arctan (d/(2 h)). Once reflected, the optical beam propagates upwards and passes through a fourth array of metalenses 115-4, which focus the optical beams into the optical aperture of the vertical PIN diode 205 at the RX channel.

Figure 3:
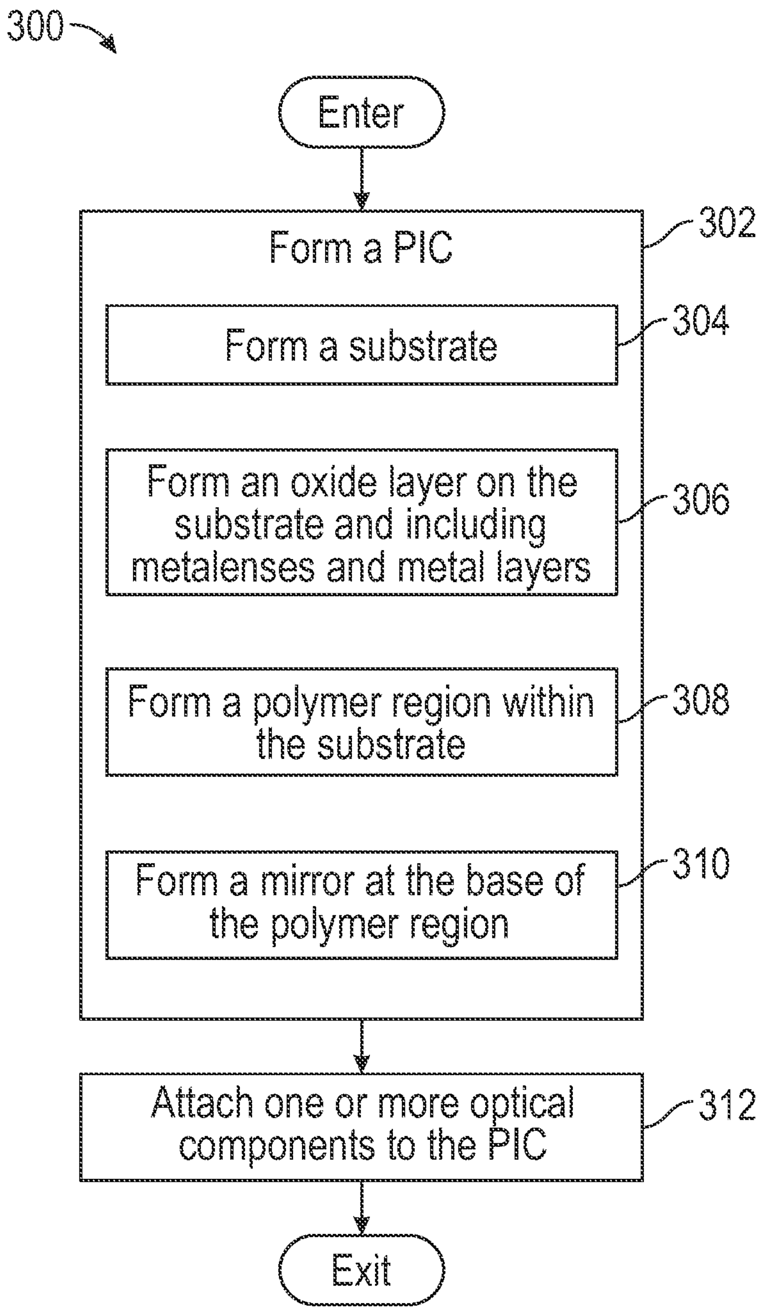
FIG. 3 is a flowchart of an example method for fabricating an optical subsystem, according to one embodiment.

FIG. 3 is a flowchart of an example method 300 for fabricating an optical apparatus, such as optical subsystem 105, according to one embodiment. The method 300 may be performed, for example, by a semiconductor processing chamber.

Method 300 enters at block 302, where a PIC (e.g., PIC 110) is formed. Block 302 may include one or more of sub-blocks 304, 306, 308, and 310. At block 304, a substrate (e.g., substrate 220) is formed. At block 306, an oxide layer (e.g., silicon dioxide layer) with embedded metalenses (e.g., metalenses 115) and metal layers (e.g., for electrical pads 260) is formed above the substrate. At block 308, a polymer region is formed within the substrate. At block 310, a mirror is formed at the base of the polymer region. As noted, the mirror formed in block 310 may be implemented with a HR coating or a metal layer.

At block 312, one or more optical components are attached to the PIC, such that the optical components are disposed above the PIC (e.g., via flip-chip bonding). The one or more optical components can include, for example, a VCSEL (e.g., VCSEL 210), a vertical PIN diode (e.g., vertical PIN diode 205), a TX-MMF (e.g., MMF 140-1), and a RX-MMF (e.g., MMF 140-2), as illustrative, non-limiting examples.

Advantageously, embodiments describe an optical subsystem that uses an integration approach based on a PIC with dielectric metalenses implemented in silicon nitride to avoid the assembly complexity of external polymer lenses as well as the misalignment issues associated with the transceiver assembly process. Additionally, additional fabrication steps, such as substrate backside etching and wafer grinding enable the transformation of the mechanical substrate for component placement into an optical device with the desired functionality.

For example, the alignment error in the X axis—the direction between the emitting optical components (VCSEL for transmitter and RX-MMF for receiver) and receiving optical components (TX-MMF for transmitter and vertical PIN diode for receiver)—may be based on one or more impairments. A first impairment may be based on the pick-and-place system, which introduces some alignment error during the attachment of the optical components. In certain embodiments, surface tension self-alignment of micro bumps for wafer-level flip-chip bonding can be leveraged to reduce this misalignment error.

A second impairment may be based on the deviation in the angle theta, θ, from the desired value. In certain embodiments where the tilting is provided by metalenses 115, this error can be minimized by the high resolution in the lithographical definition of the nanostructures (e.g., nanopillars and/or nanoholes). In other embodiments where the tilting is achieved by the flip-chip attachment of the VCSEL with a tilt angle, this error can be minimized by controlling the size of solder bumps and VCSEL chip dimensions.

A third impairment may be based on the deviation in the desired PIC thickness, which can introduce an alignment error in the X axis. In certain embodiments, this alignment error can be minimized by using grinding to control the wafer thickness.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system or method. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system."

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical apparatus comprising:
- a photonic integrated circuit (PIC);
- a vertical cavity surface emitting laser (VCSEL) disposed on the PIC;
- a photodetector disposed on the PIC;
- a transmit multimode fiber (TX-MMF) disposed on the PIC; and
- a receiver multimode fiber (RX-MMF) disposed on the PIC, wherein the PIC comprises:
  - a substrate comprising (i) a polymer region and (ii) a mirror disposed at a base of the polymer region;
  - an oxide layer disposed above the substrate; and
  - a plurality of metalenses disposed in the oxide layer, wherein a first metalens of the plurality of metalenses is configured to output a collimated optical beam through the polymer region towards the mirror and wherein a second metalens of the plurality of metalenses is configured to receive a reflected collimated optical beam reflected from the mirror and to output a focused optical beam into the TX-MMF.

2. The optical apparatus of claim 1, wherein:
- the VCSEL is disposed above the first metalens of the plurality of metalenses; and
- the TX-MMF is disposed above the second metalens of the plurality of metalenses.

3. The optical apparatus of claim 2, wherein:
- the VCSEL is configured to emit an optical beam in a vertical direction through the first metalens; and
- the first metalens is configured to receive the optical beam from the VCSEL.

4. The optical apparatus of claim 3, wherein the first metalens is further configured to apply a tilt to the optical beam received from the VCSEL.

5. The optical apparatus of claim 1, wherein:
- the photodetector is disposed above a third metalens of the plurality of metalenses; and
- the RX-MMF is disposed above a fourth metalens of the plurality of metalenses.

6. The optical apparatus of claim 5, wherein:
- the RX-MMF is configured to output an optical beam through the fourth metalens;
- the fourth metalens is configured to receive the optical beam and to output a collimated optical beam towards the mirror; and
- the third metalens is configured to receive a reflected collimated optical beam reflected from the mirror and to output a focused optical beam into the photodetector.

7. The optical apparatus of claim 6, wherein an endface of the RX-MMF proximal to the photodetector has an inclined surface, such that the optical beam is output from the RX-MMF at a tilted angle.

8. The optical apparatus of claim 1, wherein the photodetector is a vertical PIN diode.

9. The optical apparatus of claim 1, wherein the mirror comprises a metal layer.

10. The optical apparatus of claim 1, wherein the mirror comprises a high reflective coating.

11. The optical apparatus of claim 1, wherein the oxide layer comprises silicon dioxide.

12. The optical apparatus of claim 1, wherein each of the plurality of metalenses comprises an array of nanostructures comprising a silicon nitride layer.

13. A method for fabricating an optical apparatus, comprising:

forming a photonic integrated circuit (PIC);

forming a vertical cavity surface emitting laser (VCSEL) on the PIC;

forming a photodetector on the PIC;

forming a transmit multimode fiber (TX-MMF) on the PIC; and forming a receiver multimode fiber (RX-MMF) on the PIC, wherein forming the PIC comprises:

forming a substrate;

forming an oxide layer above the substrate and comprising a plurality of metalenses;

forming a polymer region within the substrate; and forming a mirror at a base of the polymer region, wherein a first metalens of the plurality of metalenses is configured to output a collimated optical beam through the polymer region towards the mirror and wherein a second metalens of the plurality of metalenses is configured to receive a reflected collimated optical beam reflected from the mirror and to output a focused optical beam into the TX-MMF.

14. The method of claim 13, wherein the mirror comprises a high reflective coating.

15. The method of claim 13, wherein the mirror comprises a metal layer.

16. The method of claim 13, wherein the oxide layer comprises silicon dioxide.

17. The method of claim 13, wherein each of the plurality of metalenses comprises an array of nanostructures comprising a silicon nitride layer.

18. The method of claim 17, wherein the array of nanostructures comprises at least one of (i) one or more nanopillars or (ii) one or more nanoholes.

19. The method of claim 13, wherein the photodetector comprises a vertical PIN diode.

20. A system comprising:

a first optical transceiver module; and a second optical transceiver module, wherein the first optical transceiver module is coupled to the second optical transceiver module via two or more multimode fibers (MMFs) and wherein the first optical transceiver module comprises:

a photonic integrated circuit (PIC);

a vertical cavity surface emitting laser (VCSEL) disposed on the PIC;

a photodetector disposed on the PIC;

a first of the two or more MMFs disposed on the PIC; and a second of the two or more MMFs disposed on the PIC, wherein the PIC comprises:

a substrate comprising (i) a polymer region and (ii) a mirror disposed at a base of the polymer region;

an oxide layer disposed above the substrate; and a plurality of metalenses disposed in the oxide layer, wherein a first metalens of the plurality of metalenses is configured to output a collimated optical beam through the polymer region towards the mirror and wherein a second metalens of the plurality of metalenses is configured to receive a reflected collimated optical beam reflected from the mirror and to output a focused optical beam into the first of the two or more MMFs.

* * * * *